United States Patent
Okamoto et al.

(10) Patent No.: US 10,193,068 B2
(45) Date of Patent: Jan. 29, 2019

(54) METHOD OF MANUFACTURING A SPECIFICALLY DIMENSIONED THIN FILM TRANSISTOR, THIN FILM TRANSISTOR, AND TRANSISTOR ARRAY

(71) Applicants: DIC Corporation, Tokyo (JP); National University Corporation Yamagata University, Yamagata-shi (JP)

(72) Inventors: Tomoko Okamoto, Sakura (JP); Kenichi Yatsugi, Sakura (JP); Yoshinori Katayama, Sakura (JP); Kenjiro Fukuda, Wako (JP); Daisuke Kumaki, Yonezawa (JP); Shizuo Tokito, Yonezawa (JP)

(73) Assignees: DIS Corporation, Tokyo (JP); National University Corporation Yamagata University, Yamagata-shi (JP)

( * ) Notice: Subject to any disclaimer, the term of this patent is extended or adjusted under 35 U.S.C. 154(b) by 0 days.

(21) Appl. No.: 14/844,322

(22) Filed: Sep. 3, 2015

(65) Prior Publication Data
US 2016/0072068 A1 Mar. 10, 2016

(30) Foreign Application Priority Data
Sep. 5, 2014 (JP) ................................. 2014-181522

(51) Int. Cl.
*H01L 51/00* (2006.01)
*H01L 51/10* (2006.01)
*H01L 51/05* (2006.01)

(52) U.S. Cl.
CPC ...... *H01L 51/0022* (2013.01); *H01L 51/0541* (2013.01); *H01L 51/102* (2013.01);
(Continued)

(58) Field of Classification Search
CPC ............... H01L 51/003; H01L 51/0022; H01L 51/0024; H01L 51/0045; H01L 51/0054
See application file for complete search history.

(56) References Cited

U.S. PATENT DOCUMENTS

2004/0029382 A1* 2/2004 Kawase ............. H01L 51/0005
438/689
2008/0251844 A1 10/2008 Nomoto et al.
(Continued)

FOREIGN PATENT DOCUMENTS

JP 2006-294653 A 10/2006
JP 2008-108874 A 5/2008
(Continued)

OTHER PUBLICATIONS

Office Action dated Mar. 20, 2018, issued for the Japanese patent application No. 2014-181522 and English translation thereof.

*Primary Examiner* — Phuc Dang
(74) *Attorney, Agent, or Firm* — Locke Lord LLP

(57) ABSTRACT

Provided is a method of manufacturing a thin film transistor satisfying the relation of L<5 μm. The method includes a process of forming a streak portion by performing transfer printing on a support using a release member which is provided with an ink streak portion for forming source and drain electrodes and has mold releasability, and baking the streak portion to thereby form the source electrode constituted by a conductor and the drain electrode constituted by a conductor. In the method manufacturing a thin film transistor in which the source and drain electrodes obtained above, a semiconductor layer, an insulator layer, and a gate electrode constituted by a conductor are laminated, after the baking, in a laminated cross section of the thin film transistor to be manufactured is set to A and a channel length thereof is set to L, the ink streak portion is provided so as to satisfy the condition of L/A≥0.05.

6 Claims, 1 Drawing Sheet

(52) U.S. Cl.
CPC ...... *H01L 51/0074* (2013.01); *H01L 51/0094* (2013.01); *H01L 51/052* (2013.01); *H01L 51/0545* (2013.01); *H01L 51/0566* (2013.01)

(56) References Cited

U.S. PATENT DOCUMENTS

| | | | |
|---|---|---|---|
| 2009/0027580 | A1 | 1/2009 | Kurokawa et al. |
| 2011/0121281 | A1 | 5/2011 | Kotake et al. |
| 2012/0100667 | A1* | 4/2012 | Koutake ............. H01L 51/0022 438/99 |
| 2012/0138940 | A1 | 6/2012 | Sato |
| 2013/0277661 | A1 | 10/2013 | Oseki |

FOREIGN PATENT DOCUMENTS

| | | | |
|---|---|---|---|
| JP | 2008-263038 | A | 10/2008 |
| JP | 2008-270245 | A | 11/2008 |
| JP | 2009-055008 | A | 3/2009 |
| JP | 2009-283862 | A | 12/2009 |
| JP | 2011-228679 | A | 11/2011 |
| JP | 2012-119532 | A | 6/2012 |
| JP | 2012-212747 | A | 11/2012 |
| JP | 2014-145832 | A | 8/2014 |
| WO | WO-2010/010791 | A1 | 1/2010 |
| WO | 2010/113931 | A1 | 10/2010 |
| WO | 2012/086609 | A1 | 6/2012 |

\* cited by examiner

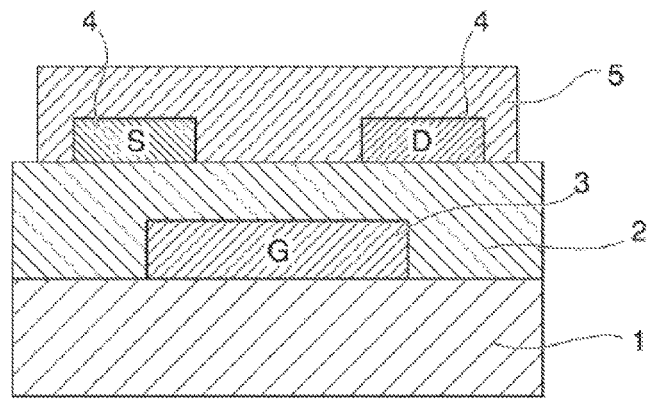
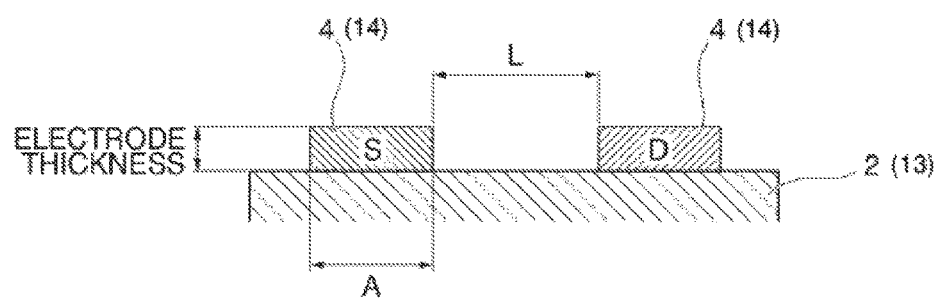
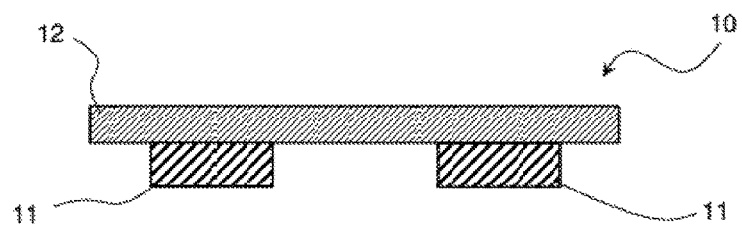

METHOD OF MANUFACTURING A SPECIFICALLY DIMENSIONED THIN FILM TRANSISTOR, THIN FILM TRANSISTOR, AND TRANSISTOR ARRAY

CROSS REFERENCE TO RELATED APPLICATIONS

This application is related to co-pending application: "THIN FILM TRANSISTOR, TRANSISTOR ARRAY, METHOD OF MANUFACTURING THIN FILM TRANSISTOR, AND METHOD OF MANUFACTURING TRANSISTOR ARRAY" filed even date herewith in the names of Tomoko Okamoto, Kenichi Yatsugi, Yoshinori Katayama, Kenjiro Fukuda, Daisuke Kumaki and Shizuo Tokito, which claims priority to Japanese Application No. 2014-181412, filed Sep. 5, 2014; which application is assigned to the assignee of the instant application and which co-pending application is also incorporated by reference herein.

TECHNICAL FIELD

The present invention relates to a method of manufacturing a thin film transistor, and a thin film transistor and a transistor array which are obtained by the method.

Priority is claimed on Japanese Patent Application No. 2014-181522, filed on Sep. 5, 2014, the entire contents thereof being thereby incorporated by reference.

DESCRIPTION OF RELATED ART

Transistors in which source and drain electrodes, a semiconductor layer, an insulator layer, and a gate electrode constituted by a conductor are laminated have been expected to be utilized for liquid crystal displays, electronic paper, electroluminescence (EL) display devices, RF-ID tags, and the like.

In the transistors used for the above-mentioned purposes, an electrode and a semiconductor layer have been manufactured through a formation step of a dry process such as vapor deposition or sputtering. In recent years, there has been stronger demand for an increase in the density, a reduction in the size, and an improvement in the productivity of a transistor, and thus a method of manufacturing a transistor that does not require large-scale and expensive vacuum equipment, which is essential for a case in which a vapor deposition method is adopted, has been examined. In recent years, attention has been paid to a wet process such as a printing method capable of suppressing energy consumption due to operation in lowered temperature, increasing productivity, and achieving an increase in density and a reduction in size.

In such a wet process, a method of applying nano-silver ink on a polycarbonate film by spin coating and baking the nano-silver ink to thereby form a gate electrode; forming a gate insulating layer on the gate electrode; forming a streak portion corresponding to a source electrode and a drain electrode by performing reverse printing of the nano-silver ink on the gate insulating layer; forming the source electrode and the drain electrode by baking the streak portion; and further forming a semiconductor layer on the source electrode and the drain electrode is known as a method of manufacturing a transistor having, for example, a bottom-gate bottom-contact type (BGBC type) structure (see Patent Literature 1).

However, a transistor obtained by the wet process, disclosed in Patent Literature 1, has an extremely large channel length (L) of 50 µm, which was a limit of a technical level at that time. In view of the present level required, for example, in an integrated circuit having excellent high-speed responsiveness, a drastic reduction in a channel length L in a transistor used for the integrated circuit, that is, a short channel is required.

However, in a wet process using transfer printing, a concrete method of manufacturing a transistor which is capable of achieving a short channel is not known.

DOCUMENTS OF RELATED ART

Patent Literature

[Patent Literature 1] WO2010/010791

SUMMARY OF THE INVENTION

Therefore, a problem that the invention is to solve is to provide an optimum manufacturing method for manufacturing a short-channel thin film transistor which is suitable for obtaining an integrated circuit having excellent high-speed responsiveness using transfer printing, specifically, a thin film transistor having a channel length L of less than 5 µm.

The inventors have found out as a result of wholeheartedly researching to solve such problems that the above-mentioned problem can be solved by satisfying a specific relationship between a channel length and an electrode width of the narrowest portion in an electrode having a small electrode width out of a source electrode and a drain electrode which constitute a transistor, and have completed the present invention.

That is, the present invention provides a method of manufacturing a thin film transistor satisfying the relation of L<5 µm. The method includes a process of forming a streak portion by performing transfer printing on a support using a member to be transferred which is provided with an ink streak portion for forming source and drain electrodes and has mold releasability, and baking the streak portion, to thereby form the source electrode constituted by a conductor and the drain electrode constituted by a conductor. In the method manufacturing a thin film transistor in which the source and drain electrodes obtained above, a semiconductor layer, an insulator layer, and a gate electrode constituted by a conductor are laminated, when an electrode width of the narrowest portion in an electrode having a small electrode width out of the source electrode and the drain electrode, after the baking, in a laminated cross section of the thin film transistor to be manufactured is set to A and a channel length thereof is set to L, the ink streak portion is provided so as to satisfy the condition of L/A≥0.05.

According to a method of manufacturing a thin film transistor of the present invention, when the narrowest portion in an electrode having a small electrode width out of a source electrode and a drain electrode is set to A and a channel length is set to L, an ink streak portion is provided so as to satisfy the relation of L/A≥0.05, and thus a particularly remarkable technical effect that a short-channel thin film transistor, satisfying the relation of L<5 µm, which is suitable for obtaining an integrated circuit having excellent high-speed responsiveness can be manufactured with high productivity is exhibited.

BRIEF DESCRIPTION OF THE DRAWINGS

FIG. 1 is a cross-sectional view of a BGBC type transistor.
FIG. 2 is a diagram illustrating an electrode width A, a channel length L, and an electrode thickness.

FIG. 3 is a cross-sectional view of a ink streak portion transfer-forming member.

DETAILED DESCRIPTION OF THE INVENTION

The present invention relates to a method of manufacturing a thin film transistor satisfying the relation of L<5 μm. The method includes a process of forming a streak portion by performing transfer printing on a support using a member to be transferred which is provided with an ink streak portion for forming source and drain electrodes and has mold releasability, and baking the streak portion, to thereby form the source electrode constituted by a conductor and the drain electrode constituted by a conductor. In the method of manufacturing a thin film transistor in which the source and drain electrodes obtained above, a semiconductor layer, an insulator layer, and a gate electrode constituted by a conductor are laminated, when an electrode width of the narrowest portion in an electrode having a small electrode width out of the source electrode and the drain electrode, after the baking, in a laminated cross section of the thin film transistor to be manufactured is set to A and a channel length thereof is set to L, the ink streak portion is provided so as to satisfy the condition of L/A≥0.05.

In the present invention, the thin film transistor refers to a transistor in which source and drain electrodes, a semiconductor layer, an insulator layer, and a gate electrode constituted by a conductor are laminated in any order. In general, the thickness of the thin film transistor which does not include a substrate serving as a support is 0.2 μm to 3 μm.

The thin film transistor in the present invention may have any of, for example, a top gate bottom contact structure (TGBC type), a bottom gate bottom contact structure (BGBC type), a bottom gate top contact structure (BGTC type), and a top gate top contact structure (TGTC type). FIG. 1 is a cross-sectional view of a BGBC type transistor.

In the TGBC type structure among the above-mentioned thin film transistor structures, it is possible to increase a contact area between a semiconductor and source and drain electrodes in a channel formation portion and to improve charge injection efficiency, and thus transistor characteristics such as, for example, field effect mobility which has been difficult to improve in the BGBC type structure can be expected to be improved.

The thin film transistor in the present invention can be easily manufactured by laminating source and drain electrodes constituted by a conductor, a semiconductor layer, an insulator layer, and a gate electrode constituted by a conductor on a substrate in any order so as to exhibit the function of a transistor.

The present invention has a feature that a source electrode and a drain electrode in a thin film transistor are manufactured by a specific manufacturing method. This specific manufacturing method refers to a method of manufacturing source and drain electrodes by a wet method instead of forming the electrodes by a dry method such as vapor deposition.

A substrate which is applicable to a thin film transistor of the present invention is not limited. For example, it is possible to use a metal thin plate such as stainless steel which is provided with silicon, a thermal silicon oxide film of which the surface is turned into a silicon oxide so as to become an insulating layer, glass, and an insulating layer; plastic films such as polycarbonate (PC), polyethylene terephthalate (PET), polyimide (PI), polyether sulfone (PES), polyethylene naphthalate (PEN), a liquid crystal polymer (LCP), polyparaxylylene, and cellulose; and a composite film obtained by giving a gas barrier layer, a hard coat layer, and the like to the plastic films. Among these, from the viewpoint of making a transistor flexible, a plastic film can be preferably used as the substrate. In addition, the thickness of the substrate is not limited, but is preferably less than 150 μm in terms of flexibility and weight reduction.

In the method of manufacturing a thin film transistor of the present invention, in order to form a source electrode and a drain electrode, a process of forming a streak portion (14) by performing transfer printing on a support (13) using a release member (12), having mold releasability, which is provided with an ink streak portion (11) corresponding to the source and drain electrodes, and baking the streak portion (14), to thereby form the source and drain electrodes (4) constituted by a conductor is included as an essential process as illustrated in FIGS. 2 and 3.

Hereinafter, the phrase "in order to form a source electrode and a drain electrode, a release member, having mold releasability, which is provided with an ink streak portion corresponding to the source and drain electrodes" may be referred to as the phrase "ink streak portion transfer-forming member" (10), and the phrase "ink streak portion, corresponding to the source and drain electrodes, for forming the source and drain electrodes" may be referred to as the phrase "electrode forming ink streak portion" (11) as illustrated in FIG. 3.

A method of forming a source electrode and a drain electrode by the above-mentioned printing does not require an expensive vacuum device compared to a method of obtaining a source electrode and a drain electrode by a dry method such as vapor deposition, and can allow the production cost including equipment investment to be drastically reduced. In addition, the temperature of a process can be decreased, and a plastic substrate can be used as a substrate, and thus it is preferable in terms of realizing essential items in the ubiquitous era, that is, flexibility and low cost.

In a method of manufacturing a thin film transistor in which a source electrode and a drain electrode are formed by a wet method, which is represented by the above-mentioned printing method of the present invention, the streak portion is formed of ink (hereinafter, referred to as "conductive ink") which forms a conductor by baking. Any ink which is known and in common use can be used as the conductive ink used in the present invention. However, for example, it is possible to use ink in which a conductive material such as conductive metal particles or a conductive polymer is dissolved or dispersed in a solvent (dispersion medium).

As the conductive metal particles, for example, metal particles such as gold, silver, copper, nickel, zinc, aluminum, calcium, magnesium, iron, platinum, palladium, tin, chromium, and lead, and an alloy of the metals such as silver/palladium; thermally decomposable metal compounds, such as a silver oxide, organic silver, organic gold, which are given a conductive metal by thermal decomposition at a relatively low temperature; and conductive metal oxide particles such as a zinc oxide (ZnO) and an indium tin oxide (ITO) can be used.

As the conductive polymer, for example, polyethylenedioxythiophene/polystyrene sulfonic acid (PEDOT/PSS), polyaniline, and the like can be used. Further, a carbon-based conductive material such as carbon nanotube can also be used.

Although a type of solvent (dispersion medium) is not particularly limited, water or an organic solvent capable of dissolving or dispersing a conductive material can be appropriately selected. Specifically, for example, water, various types of organic solvents such as aliphatic hydrocarbon-based, aromatic hydrocarbon-based, alcohol-based, ketone-based, ether-based, and ester-based solvents, and intramolecular hydrogen thereof being partially and entirely fluorinated can be used. Among these, only one type may be used, or two or more types may be used in combination.

Not only the conductive material and the solvent (dispersion medium), but also a binder component such as a resin, an antioxidant, various types of catalysts for promoting film formation, various types of surfactants such as a silicone-based surfactant and a fluorine-based surfactant, a leveling agent, a release accelerator, and the like can be added to the conductive ink when necessary.

The conductive ink can be configured as thermosetting ink by being mixed with a cationically polymerizable compound such as an oxetane compound, an epoxy compound, or a vinylether compound, or a radically polymerizable compound such as a compound containing a vinyl group or a (meth)acryloyl group, or can be configured as active energy ray-curable ink such as ultraviolet rays or an electron beam. However, such a polymerizable compound may change in volume due to expansion and contraction after polymerization, and thus it is preferable to use a non-polymerizable compound.

As the conductive material, it is possible to form any streak with a smaller line width and to form a conductor by baking at a lower temperature, and thus it is preferable to use conductive material particles of the nm order.

In preparing ink using the conductive metal particles of the nm order, it is preferable to use conductive metal particles, coated with a binder component, which are relatively stable at near room temperature but can form a conductor by baking at a relatively low temperature such as equal to or less than 150° C. The binder component may be a component functioning as a protective agent or a dispersing agent for the conductive metal particles. As a material that can be used as such a binder component, a thermoplastic resin having no curability mentioned above is preferably used. For example, the material can include straight chain or branched polyethyleneimine, a polyethyleneimine-polyalkyleneglycol copolymer, an N-oxidized derivative thereof, an N-acetylated derivative thereof, a cationic resin such as polyvinyl-2-pyrrolidone, an anionic resin such as a poly-alkyleneglycol mono(meth)acrylate/(meth)acryloyloxyalky-lacidphosphate copolymer, alkanethiols, and alkylamines.

As the method of manufacturing a thin film transistor of the present invention, as mentioned above, in order to form a source electrode and a drain electrode, transfer printing is performed on a support using an ink streak portion transfer-forming member, and a streak portion on the transferred support is baked, and thus it is preferable to use conductive ink suitable for the successive execution of this process.

Examples of a method of performing transfer printing on a support using the ink streak portion transfer-forming member include a gravure offset printing method and a reverse printing method.

The gravure offset printing method is a printing method including a process using a gravure plate provided with a concave portion corresponding to streaks of a source electrode and a drain electrode (having the same pattern as the streak) and a member to be transferred having mold releasability. The method comprises a process of filling the concave portion of the gravure plate with conductive ink, a process of transferring the conductive ink filled in the concave portion to the surface of the member to be transferred having mold releasability to thereby obtain an ink streak portion transfer-forming member, and a process of transferring an ink streak portion moved to the member to be transferred onto the support.

On the other hand, the reverse printing method uses a relief printing plate provided with a convex portion corresponding to reverse patterns of a source electrode and a drain electrode and a member to be transferred having mold releasability. The reverse printing method is a printing method including a process of applying conductive ink onto the entire surface of the member to be transferred, a process of pressing the relief printing plate against the surface of the conductive ink applied onto the member to be transferred to thereby transfer an ink portion corresponding to the reverse patterns of the source and drain electrodes onto the relief printing plate and to remove the ink portion, and a process of performing transfer printing on a support such as a substrate using the member to be transferred provided with an ink streak portion corresponding to the source electrode and the drain electrode by the removal of the reverse patterns pressed by the relief printing plate.

That is, in the present method, a relief printing plate has a convex portion having a reverse pattern of a desired ink streak portion. Thereby, an ink portion corresponding to reverse patterns of a source electrode and a drain electrode is transferred onto the relief printing plate, and thus a streak portion, corresponding to the source electrode and the drain electrode, which has not been pressed by the relief printing plate remains on a member to be transferred. Since the member to be transferred has mold releasability, the member to be transferred, having mold releasability, which is provided with streaks corresponding to the source electrode and the drain electrode is brought into contact with a support such as a substrate, and thus the streak portion is transferred to the support.

As a printing method of forming a streak portion by conductive ink corresponding to a source electrode and a drain electrode in the method of manufacturing a thin film transistor of the present invention, a reverse printing method is more preferable than a gravure offset printing method because an ink streak portion having a smaller line width and a smaller film thickness can be formed.

A streak portion with conductive ink corresponding to a source electrode and a drain electrode forms source and drain electrodes constituted by a conductor, for example, by heating in an oven or baking by irradiation with far-infrared rays. Volatile components contained in the conductive ink are removed from the conductor by the baking. In addition, when a binder component is decomposed, the binder component disappears from the inside of the formed conductor. However, when the amount of binder components is extremely smaller than that of conductive materials, the film thickness and shape of the streak portion do not change in the streak portion of the conductive ink before and after the baking and in the streak portion of the conductor obtained after the baking. When a significant reduction in the film thickness of the streak portion and a significant change in the shape thereof are estimated before and after the baking, it is possible to obtain a source electrode and a drain electrode which have an intended film thickness and shape as conductors by forming the ink streak portion so as to have a larger thickness and changing the shape of a plate by estimating these changes.

In the present invention, in a laminated cross section of a thin film transistor, when an electrode width of the narrowest portion of an electrode having a small electrode width out of a source electrode and a drain electrode after baking is set to A and a channel length thereof is set to L, the above-mentioned ink streak portion is provided so as to satisfy the relation of L/A≥0.05. Meanwhile, in the present invention, the laminated cross section of the thin film transistor refers to a cross section in which both cross sections of a source electrode and a drain electrode are shown as illustrated in FIG. 2. In FIG. 2, for convenience of description, source and drain electrodes 4 are formed on an insulator layer 2, but a layer under the electrodes is not limited thereto. In addition, a layer on the electrodes is not shown in the drawing.

In general, in many cases, a source electrode and a drain electrode of a thin film transistor are designed to have the same shape when seen in a laminated cross section. For this reason, in such a case, an electrode width of either of the source electrode and the drain electrode may be set to be the electrode width A. However, when electrode widths of both the electrodes are different from each other, either one of the electrodes which has a smaller electrode width is selected, and an electrode width of the narrowest portion of the electrode in a plurality of measurable laminated cross sections is set to be the electrode width A.

In this manner, when an electrode width is set to A and a channel length is set to L, an ink streak portion is provided so as to satisfy the relation of L/A≥0.05 after baking, preferably, the relation of L/A=0.1 to 1.0. Thereby, it is possible to provide an electrode so as to have an extremely short channel length L of less than 5 μm, preferably, 1 μm to 3 μm, and thus a thin film transistor being optimal for obtaining an integrated circuit having excellent high-speed responsiveness, and the like.

According to the above-mentioned method of performing transfer printing on a support using an ink streak portion transfer-forming member to thereby form an electrode forming ink streak portion, electrode thicknesses of source and drain electrodes in a laminated cross section of a thin film transistor after baking become the same, and thus the formation of the source and drain electrodes having an extremely small film thickness is extremely facilitated.

In addition, according to the above-mentioned method of performing transfer printing on a support using an ink streak formation member to be transferred to thereby form an electrode forming ink streak portion, adopted electrode widths A in a laminated cross section of a thin film transistor are not different from each other in the thickness direction, and thus source and drain electrodes, having a rectangular electrode shape, which have no transfer abnormality are obtained. The thin film transistor including the source electrode and the drain electrode is configured as a thin film transistor having smaller variations in mobility and a threshold voltage during the driving thereof.

Specifically, it is possible to easily obtain a source electrode and a drain electrode, having an appropriate electrode shape, which have the same electrode thickness and each of which is constituted by a conductor having an extremely small thickness of equal to or less than 100 nm, preferably, 30 nm to 80 nm and has no abnormality such as concavities or convexities. As a result, such a transistor has an improved uniformity of a film thickness and crystal of a semiconductor layer located at an upper layer as well as being optimal for obtaining an integrated circuit having excellent high-speed responsiveness, and the like, and thus is configured as a thin film transistor with smaller variations in mobility and a threshold voltage at the time of being driven as a thin film transistor. Such excellent features are features of the above-mentioned transfer printing which cannot be achieved in a printing method of the related art such as a screen printing method or an ink jet printing method.

As the electrode width A, an electrode width having no difference between a maximum value and a minimum value thereof in each electrode in a plurality of measurable laminated cross sections is preferably used, but this difference being equal to or less than 1 μm, particularly, equal to or less than 0.5 μm is preferable in terms of suppressing variations in mobility and a threshold voltage.

Although not shown in the cross-sectional view of FIG. 2, a source electrode and a drain electrode are formed toward the depth direction from the front direction of the drawing. The channel length L may be measured for any cross section toward the depth direction from the front direction of the drawing, but particularly, it is most preferable that all of individual channel lengths L in a plurality of measurement cross sections are equal to each other. Individual channel lengths L1, L2, L3 . . . in a plurality of measurement cross sections are measured, and thus it is possible to obtain a standard deviation σ equivalent to a variation in each of the channel lengths in the plurality of measurement cross sections. The standard deviation σ is preferably equal to or less than 0.5 μm, and a more preferable result is obtained as the value of the standard deviation becomes smaller (becomes closer to zero).

When a source electrode and a drain electrode are obtained, for example, by the above-mentioned reverse printing method, a relief printing plate provided with a convex portion (convex shape) corresponding to a non-streak portion represented by a portion other than streaks of the source electrode and the drain electrode is pressed against the entire surface of a member to be transferred having mold releasability, and thus a portion, representative as the non-streak portion, which is equivalent to a channel before baking is transferred onto the relief printing plate and is removed. That is, since the length of an upper bottom in a column top of the convex portion (convex shape) corresponds to the channel length L after baking, the length of the upper bottom in the column top of the convex portion is less than 5 μm as described above, and upper bottoms of individual convex portions (convex shapes) in a plurality of measurement cross sections are set to have the same length, and thus it is possible to effectively suppress variations in the individual channel lengths in the plurality of measurement cross sections, for example, in the depth direction from the front direction in the cross-sectional view of FIG. 2. Each of the standard deviations σ thereof is preferably equal to or less than 0.5 μm as described above, and a more preferable result is obtained as the standard deviation becomes smaller (becomes closer to zero). Particularly, it is preferable to use a relief printing plate, having a standard deviation α of equal to or less than 0.5 μm and less than a value expected as a channel length, specifically, 0.05 μm to 0.2 μm, in which an upper bottom in a column top of a convex portion (convex shape) has a length of less than 5 μm. In addition, the length of the upper bottom in the column top of the convex portion (convex shape) can be measured as described above.

A partition wall layer formed so as to surround at least a portion of the source and drain electrodes of the thin film transistor of the present invention is provided on the source and drain electrodes so that a film formation region of a semiconductor layer located at an upper layer is limited, and thus it is possible to suppress a variation in an overlapping width between the semiconductor layer and the source and drain electrodes for each element. In a case of being driven as a thin film transistor by suppressing a variation in an overlapping width, it is possible to obtain a thin film transistor with smaller variations in mobility and a threshold voltage. In particular, when the semiconductor layer is formed by a wet process, there is a tendency for semiconductor ink to unevenly wet-spread on the source and drain electrodes, and thus it is preferable to provide the partition wall layer in advance before forming the semiconductor layer.

A material used for the above-mentioned partition wall layer is not limited insofar as a material having an insulation property is contained therein. Although an organic or inorganic material which is known and in common use can be used, a liquid repellent material is preferably used because the film formation region of the semiconductor layer is easily controlled at the time of being made to function as a partition wall layer. In addition, any method can be adopted as a method of forming a partition wall layer, a formation method of performing transfer printing of a member to be transferred, having mold releasability, which is provided in an ink streak portion corresponding to the partition wall layer, on a support provided with source and drain electrodes is preferably used in that a high definition partition wall layer is obtained.

The source and drain electrodes of the thin film transistor of the present invention are subjected to surface treatment when necessary, and thus it is possible to improve the efficiency of charge injection into a semiconductor layer. Examples of a material to be used for the surface treatment include a thiol compound such as benzenethiol, chlorobenzenethiol, bromobenzenethiol, fluorobenzenethiol, pentafluorobenzenethiol, pentachlorobenzenethiol, trifluoromethylbenzenethiol, biphenylthiol, fluorenethiol, nitrobenzenethiol, 2-mercapto-5-nitro-benzimidazole, perfluorodecanethiol, 4-trifluoromethyl-2,3,5,6-tetrafluorothiophenol, 5-chloro-2-mercaptobenzimidazole; a disulfide compound such as diphenyl disulfide; a sulfide compound such as diphenyl sulfide; a silane coupling agent such as long-chain fluoroalkylsilane; a metal oxide such as a molybdenum oxide, a vanadium oxide, a tungsten oxide, and a rhenium oxide. Particularly, a functional group capable of being chemically coupled to the surface of an electrode is preferably used.

The surface treatment of the source and drain electrodes of the thin film transistor can be performed by either of dry and wet processes which are known and in common use, but a wet process such as a spin coating method, a bar coating method, a slit coating method, a dip coating method, a spray coating method, a dispenser method, or an ink jet method is preferably used in that a drastic reduction in a manufacturing cost can be expected.

It is possible to configure a thin film transistor by laminating a semiconductor layer, an insulator layer, and a gate electrode constituted by a conductor by any method with respect to the source and drain electrodes obtained in the above-mentioned manner so as to exhibit the function of a transistor.

An organic or inorganic semiconductor material can be used as a semiconductor material used for a semiconductor layer of a thin film transistor. Examples of the organic semiconductor material to be preferably used include phthalocyanine derivatives, porphyrin derivatives, naphthalene tetracarboxylicacid diimide derivatives, fullerene derivatives, acene compounds such as pentacene and TIPS (triisopropylsilyl) pentacene, various types of pentacene precursors, polyaromatic compounds such as anthracene, perylene, pyrene, phenanthrene, and coronene and derivatives thereof, oligothiophene and a derivative thereof, thiazole derivatives, fullerene derivatives, dinaphthothiophene-based compounds, and carbon-based compounds such as carbon nanotube as low-molecular organic semiconductors, one or more of various types of low-molecular semiconductors obtained by combining thiophene such as benzothienobenzothiophene, phenylene, vinylene, and the like, and copolymers thereof.

In addition, examples of a high molecular compound to be preferably used include polythiophene-based polymers such as polythiophene, poly(3-hexylthiophene) (P3HT), and PQT-12, thiophene-thienothiophene copolymers such as B10TTT, PB12TTT, and PB14TTT, fluorene-based polymers such as F8T2, phenylenevinylene-based polymers such as paraphenylenevinylene, arylamine-based polymers such as polytriarylamine, and the like. In addition to the organic semiconductor materials, a solution soluble Si semiconductor precursor capable of being reformed into an inorganic semiconductor by a heat treatment or energy ray irradiation of an EB or Xe flash lamp, a precursor of an oxide semiconductor such as IGZO, YGZO, or ZnO can be used.

As a semiconductor material used for a semiconductor layer of a thin film transistor, an organic semiconductor is more preferably used than an inorganic semiconductor because the organic semiconductor allows a semiconductor layer to be easily formed at a lower temperature and is easy to handle. Among organic semiconductors, an organic semiconductor having a high self-aggregating property and being likely to form a crystal structure is preferably used because it can exhibit more excellent transistor characteristics.

In order to form ink using organic and inorganic semiconductor materials, a solvent which can dissolve the semiconductor material at room temperature or by applying some heat, has a moderate volatility, and may be able to form an organic semiconductor thin film after the volatilization of the solvent, is applicable. Examples of the solvent to be used include organic solvents such as toluene, xylene, chloroform, chlorobenzenes, cyclohexylbenzene, tetralin, N-methyl-2-pyrrolidone, dimethylsulfoxide, isophorone, sulfolane, tetrahydrofuran, mesitylene, anisole, naphthalene derivatives, benzonitrile, amylbenzene, γ-butyrolactone, acetone, and methylethylketone.

In addition, it is possible to add a polymer such as polystyrene or poly(methyl methacrylate) and a surface energy adjusting agent such as a silicone-based or fluorine-based surfactant to the solutions for the purpose of improving ink characteristics. In particular, a fluorine-based surfactant added to a crystalline semiconductor solution can be preferably used because it is possible to expect not only an effect of improving ink characteristics but also characteristics of a semiconductor film formed by drying ink, for example, an improvement in the mobility of a thin film transistor.

An insulator material used for an insulator layer of a thin film transistor is not limited insofar as a material having an insulation property is contained therein. Examples of the insulator material include resins for forming an organic film such as a polyparaxylylene resin, a polystyrene resin, a polycarbonate resin, a polyvinylalcohol resin, a polyvinylacetate resin, a polysulfone resin, a polyacrylonitrile resin, a methacrylic resin, a polyvinylidene chloride resin, a fluorine-based resin, an epoxy resin, a polyimide resin, a polyamide resin, a polyamide-imide resin, a polyvinylpyrrolidone resin, a polycyanate resin, a polyolefin resin, and a polyterpene resin, a fluorine-based resin such as polyvinylidenefluoride or polytetrafluoroethylene, a resin for forming an organic film such as a (meth)acrylic resin, a diallylphthalate resin, a melamine resin, a urethane resin, a polyester resin, or an alkyd resin, or a silane compound, a silazane compound, a magnesium alkoxide compound, an aluminum alkoxide compound, a tantalum alkoxide compound, an ionic liquid, and an ionic gel for forming an inorganic film by hydrolysis and a heat treatment when necessary. Alternatively, one or two or more types thereof may be used in combination, or an oxide such as zirconia, a silicon dioxide, an aluminum oxide, a titanium oxide, or a tantalum oxide, a ferroelectric oxide such as $SrTiO_3$ or $BaTiO_3$, a nitride such as a silicon nitride or an aluminum nitride, and dielectric particles such as sulfide or fluoride can be dispersed when necessary.

A solvent applicable to form ink using an insulator material is not limited, and examples of the solvent include various types of organic solvents such as water and hydrocarbon-based, alcohol-based, ketone-based, ether-based, ester-based, glycol ether-based, and fluorine-based solvents. In addition, an antioxidant, a leveling agent, a release accelerator, and various types of catalysts for promoting film formation can be used when necessary.

The semiconductor layer, and an insulator layer and a gate electrode which are to be described later can be formed by either of dry and wet processes which are known and in common use. Specifically, a dry process represented by a vacuum deposition method, a molecular beam epitaxial growth method, an ion cluster beam method, an ion plating method, a sputtering method, an atmospheric pressure plasma method, or a CVD method, or a wet method such as a printing method as exemplified below can be used. In particular, the wet process is a preferable embodiment of the present invention because a drastic reduction in a manufacturing cost can be expected. Examples of the wet process to be used include an ink jet printing method, a screen printing method, a spin coating method, a bar coating method, a slit coating method, a dip coating method, a spray coating method, a gravure printing method, a flexographic printing method, a gravure offset printing method, a relief offset printing method, a reverse printing method, and the like.

When a semiconductor layer is formed by a printing method, semiconductor ink used therefor can be prepared by dissolving or dispersing various types of semiconductor materials, which are known and in common use, in a solvent.

When an insulator layer such as a gate insulating film is formed by a printing method, insulator ink used therefor can be prepared by dissolving or dispersing various types of semiconductor materials, which are known and in common use, in a solvent.

The surface of the insulator layer can be subjected to self-assembled monolayer (SAM) treatment using various types of silane coupling agents such as, for example, hexamethyldisilazane (HMDS), octyltrichlorosilane (OTS-8), octadecyltrichlorosilane, (OTS-18), dodecyltrichlorosilane (DTS), fluorine-substituted octatrichlorosilane (PFOTS), and β-phenethyltrichlorosilane in order to improve transistor characteristics.

In addition, when affinity of an interface between the insulator layer having been subjected to the above-mentioned SAM treatment and the semiconductor layer is insufficient, a fluorine-based surfactant or the like can be used when necessary in order to obtain satisfactory affinity and to improve transistor characteristics.

When a gate electrode is formed by a printing method, any conductive ink, containing the above-mentioned various types of conductive materials, which can be used to form source and drain electrodes can be used as conductive ink used for the gate electrode. Regarding the gate electrode and the source or drain electrode, pieces of conductive ink using different conductive materials can also be used in combination in forming the electrodes. An ink streak portion corresponding to the gate electrode is subjected to baking in the same manner as when the source and drain electrodes are formed, thereby configuring the gate electrode constituted by a conductor.

A thickness of each of the semiconductor layer, the insulating layer, and the gate electrode of the thin film transistor of the present invention are not particularly limited, but the thickness of the semiconductor layer is preferably 20 nm to 100 nm in that transistor characteristics such as an improvement in the uniformity of semiconductor crystal and little variation are obtained. The thickness of the insulating layer is preferably 5 nm to 1500 nm in that it is possible to suppress a variation in an ON/OFF value. The thickness of the gate electrode is preferably 50 nm to 1000 nm in terms of excellent followability to a flexible substrate.

It is possible to form a protective film layer in the uppermost layer of the thin film transistor of the present invention if necessary. It is possible to minimize the influence of open air by providing the protective film layer and to stabilize electrical characteristics of the thin film transistor. As a protective film material used for the protective film layer, a material such as light, oxygen, water, or ions which is capable of forming a film having an excellent barrier property by reforming treatment using heat, light, an electron beam, or the like may be used, and it is possible to use, for example, the same material as the above-mentioned insulator material. When the protective film layer is formed by a wet process, an applicable solvent is not limited, and a material dissolving or dispersing the above-mentioned resin may be used. In addition, various types of silicone-based and fluorine-based surfactants can be added to the protective film material.

The thin film transistor of the present invention can be manufactured by any manufacturing method. For example, source and drain electrodes constituted by a conductor are formed by baking an ink streak portion obtained by performing transfer printing on a support using an ink streak portion transfer-forming member. Further, all layers for forming the thin film transistor, that is, a semiconductor layer, an insulator layer, and a gate electrode are formed by printing, and thus it is possible to obtain the thin film transistor capable of easily manufacturing an integrated circuit having higher productivity and excellent high-speed responsiveness, and the like. Further, the plurality of thin film transistors each of which is obtained in this manner can be integrated into a transistor array.

EXAMPLES

Manufacture of Electrode by Reverse Printing Method

Conductive ink (RAGT-25 manufactured by DIC Corporation, hereinafter, referred to as "nanoparticle silver ink") having silver particles, having an average particle size of the nanometer order, being uniformly dispersed in a liquid medium was uniformly applied on a silicone rubber face of a transparent blanket, provided with a silicone rubber layer formed on a film, using a slit coater, and was dried to such a degree that tack remains. Thereafter, a glass relief printing plate having a highly-precise convex-shaped acute angle portion (edge) was pressed against a surface which was uniformly applied with the nano-particle silver ink to remove an unnecessary portion (non-streak portion), in which the glass relief printing plate was provided with a negative pattern (convex portion of a reverse pattern) which is a desired pattern such as source and drain electrodes or a gate electrode, and the negative pattern was obtained by wet etching of glass. A pattern remaining on a blanket was lightly pressed against a substrate cut to a predetermined size, and thus a desired pattern was transferred onto the substrate. In addition, the length of an upper bottom in a column top of each of convex portions (convex shapes) in a plurality of measurement cross sections of the relief printing plate was within a range of approximately 0.7 µm, and each of the standard deviations σ thereof was equal to or less than 0.3 µm.

Evaluation of Shape

Portions of the source and drain electrodes obtained above were observed by a microscope, and the shapes thereof were evaluated according to the following standards.

A: linearity of a line is particularly excellent, and there is no contact location between the source electrode and the drain electrode B: linearity of a line is excellent, and there is no contact location between the source electrode and the drain electrode C: linearity of a line is poor, and there is a contact location between the source electrode and the drain electrode Evaluation of Semiconductor Parameter Characteristics A test element of the following thin film transistor was created, and the characteristics thereof were evaluated. Here, Id-Vg and Id-Vd characteristics were measured using a semiconductor parameter measurement device (4200 manufactured by Keithley Instruments Inc.), and field effect mobility and an ON/OFF value were calculated by a well-known method.

Example 1

A test element of a thin film transistor having a TGBC structure was created in the following order and was evaluated.

(1) Formation of source and drain electrodes: a source and drain electrode pattern was formed so as to have a channel length of 0.7 µm, a channel width of 300 µm, and an electrode width of 10 µm by manufacturing an electrode on alkali-free glass having a thickness of 0.7 mm by a reverse printing method using the above-mentioned nanoparticle silver ink, and was baked in a clean oven at 180° C. for 30 minutes, thereby forming a silver electrode having a thickness of 70 nm.

(2) Surface treatment of an electrode: the above-mentioned source and drain electrode substrate was immersed in an isopropyl alcohol solution containing 30 mmol/L of pentafluorobenzenethiol for 5 minutes, was cleaned using isopropyl alcohol, and was then dried using an air gun.

(3) Formation of a semiconductor layer: 0.5 wt % of polystyrene was added to a mesitylene solution containing 2 wt % of 2,8-difluoro-5,11-bis(triethylsilylethynyl)anthradithiophene as an organic semiconductor, and a semiconductor layer was formed on the source and drain electrodes formed in advance by an ink jet method.

(4) Formation of an insulating layer: polyparaxylilene resin (manufactured by Japan Parylene Co., Ltd., a trade name "parylene-C") was chemically vapor-deposited using a CVD method on a support having the source and drain electrodes and the semiconductor layer formed thereon, and thereby an insulating layer having a thickness of 1000 nm was formed.

(5) Formation of a gate electrode: a gate electrode pattern was formed on the insulating layer formed in advance by an ink jet printing method using conductive silver ink for an ink jet, and was baked on a hot plate at 120° C. for 30 minutes, and thereby a silver electrode having a thickness of 150 nm was formed.

Comparative Example 1

In a method of forming source and drain electrodes, a test element of a thin film transistor was created and evaluated by the same method as that in Example 1 except that a silver electrode, having a thickness of 70 nm, which was obtained by setting an electrode width to 50 µm, was used.

Example 2

In a method of forming source and drain electrodes, a test element of a thin film transistor was created and evaluated by the same method as that in Example 1 except that a silver electrode, having a thickness of 70 nm, which was obtained by setting an electrode width to 5 µm, was used.

Example 3

A test element of a thin film transistor was created and evaluated by the same method as that in Example 1 except that a method of forming source and drain electrodes was changed as follows.

Formation of source and drain electrodes: a source and drain electrode pattern was formed so as to have a channel length of 1 µm, a channel width of 500 µm, and an electrode width of 15 µm by manufacturing an electrode on alkali-free glass having a thickness of 0.7 mm by a reverse printing method using the above-mentioned nanoparticle silver ink, and was baked in a clean oven at 180° C. for 30 minutes, thereby forming a silver electrode having a thickness of 70 nm.

Example 4

A test element of a thin film transistor was created and evaluated by the same method as that in Example 1 except that a method of forming source and drain electrodes was changed as follows.

Formation of source and drain electrodes: a source and drain electrode pattern was formed so as to have a channel length of 4 µm, a channel width of 1000 µm, and an electrode width of 40 µm by manufacturing an electrode on alkali-free glass having a thickness of 0.7 mm by a reverse printing method using the above-mentioned nanoparticle silver ink, and was baked in a clean oven at 180° C. for 30 minutes, thereby forming a silver electrode having a thickness of 70 nm.

Comparative Example 2

A test element of a thin film transistor having a BGBC type structure was created in the following order and was evaluated.

(1) Formation of a gate electrode: a gate electrode pattern was formed by manufacturing an electrode on alkali-free glass having a thickness of 0.7 mm by a reverse printing method using the above-mentioned nanoparticle silver ink, and was baked in a clean oven at 180° C. for 30 minutes, thereby forming a silver electrode having a thickness of 150 nm.

(2) Formation of an insulating layer: polyparaxylilene resin (manufactured by Japan Parylene Co., Ltd., a trade name "parylene-C") was chemically vapor-deposited using a CVD method on a support having the source and drain electrodes and the semiconductor layer formed thereon, thereby an insulating layer having a thickness of 500 nm was formed.

(3) Formation of source and drain electrodes: an ink pixel portion equivalent to a source and drain electrode pattern was formed so as to have a channel length of 50 μm and a channel width of 500 μm by manufacturing an electrode by a reverse printing method using the above-mentioned nanoparticle silver ink, and was baked in a clean oven at 180° C. for 30 minutes, thereby a silver electrode having a thickness of 70 nm was formed.

(4) Surface treatment of an electrode: the above-mentioned source and drain electrode substrate was immersed in an isopropyl alcohol solution containing 30 mmol/L of pentafluorobenzenethiol for 5 minutes, was cleaned using isopropyl alcohol, and was then dried using an air gun.

(5) Formation of a semiconductor layer: 0.5 wt % of polystyrene was added to a mesitylene solution containing 2 wt % of 2,8-difluoro-5,11-bis(triethylsilyl ethynyl)anthradithiophene as an organic semiconductor, and a semiconductor layer was formed on channels of the source and drain electrodes formed in advance by an ink jet printing method.

A channel length L, an electrode width A, L/A, a channel shape, a standard deviation $\sigma_L$ of a channel length, and obtained transistor characteristics which were measured in source and drain electrodes are shown in Table 1.

In addition, in all of the above-mentioned experiments, conditions of reverse printing were selected so that electrode widths of source and drain electrodes after baking became the same. For this reason, the source electrode which is one of the electrodes after baking and before forming a semiconductor layer located at upper side was selected, an electrode width was measured with any five cross sections of the laminated cross section thereof in the depth direction from the front direction as targets, and a value of a smallest electrode width was set to an electrode width A. Regarding the channel length L, lengths of channels corresponding to the five cross sections in which an electrode width was measured in the source electrode were measured, and standard deviations σ were obtained from the measured values.

that excellent field effect mobility is also not obtained in a BGBC type thin film transistor having a large channel length L as in the related art.

According to the method of manufacturing a thin film transistor of the present invention, a thin film transistor having a channel length L of less than 5 μm is easily obtained, and thus it is possible to easily manufacture an integrated circuit, for example, having excellent high-speed responsiveness.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: SUBSTRATE
2: INSULATOR LAYER
3, G: GATE ELECTRODE
4: SOURCE ELECTRODE AND DRAIN ELECTRODE
5: SEMICONDUCTOR LAYER
S: SOURCE ELECTRODE
D: DRAIN ELECTRODE
A: ELECTRODE WIDTH
L: CHANNEL LENGTH

What is claimed is:

1. A method of manufacturing a thin film transistor having a top gate bottom contact structure satisfying a relation of L<5 μm, the method comprising a process of forming a streak portion by performing transfer printing on a support using a release member which is provided with an ink streak portion for forming source and drain electrodes and has mold releasability, and baking the streak portion, to thereby form the source electrode constituted by a conductor and the drain electrode constituted by a conductor,

TABLE 1

|  | Example 1 | Comparative Example 1 | Example 2 | Example 3 | Example 4 | Comparative Example 2 |
|---|---|---|---|---|---|---|
| Channel length L (μm) | 0.7 | 0.7 | 0.7 | 1 | 4 | 50 |
| Electrode width A (μm) | 10 | 50 | 5 | 15 | 40 | 500 |
| L/A | 0.07 | 0.01 | 0.14 | 0.07 | 0.1 | 0.1 |
| Channel shape | B | C | A | A | A | B |
| $\sigma_L$ | 0.2 | 0.7 | 0.1 | 0.2 | 0.2 | 0.6 |
| Field effect mobility (cm$^2$/Vs) | 0.02 | No characteristic | 0.04 | 0.1 | 0.4 | 0.001 |
| ON/OFF value | $1 \times 10^2$ | <10 | $1 \times 10^4$ | $3 \times 10^4$ | $1 \times 10^6$ | $2 \times 10^6$ |

As seen from comparison between Example 1 and Comparative Example 1, when a reverse printing method is devised and adopted, it is obvious that field effect mobility or an ON/OFF value drastically changes around a boundary of the vicinity of channel length L/electrode width A=0.05 in channel length L<5 μm even in a TGBC type thin film transistor and that excellent field effect mobility or ON/OFF value is not obtained in a case where the relation of L/A≥0.05 is not satisfied. In addition, as seen from comparison between Example 1 and Comparative Example 2, even when the relation of L/A≥0.05 is satisfied, it is obvious wherein in the method of manufacturing the thin film transistor having a top gate bottom contact structure in which the source and drain electrodes obtained above, a semiconductor layer, an insulator layer, and a gate electrode constituted by a conductor are sequentially laminated in this order, when an electrode width of a narrowest portion in an electrode having a small electrode width out of the source electrode and the drain electrode, after the baking, in a laminated cross section of the thin film transistor having a top gate bottom contact structure to be manufactured is set to A and a channel length thereof is set to L, the ink streak portion is provided so as to satisfy the condition of L/A≥0.05;

wherein the ink streak portion is formed so that electrode thicknesses of the source and drain electrodes, after baking, in the laminated cross section of the thin film transistor having a top gate bottom contact structure become the same and both the electrode thicknesses of the source and drain electrodes are set to be equal to or less than 100 nm; and wherein all of the semiconductor layer, the insulator layer, and the gate electrode are formed by a method selected from the group consisting of an ink jet printing method, a screen printing method, a gravure printing method, a flexographic printing method, a gravure offset printing method, a relief offset printing method, a reverse printing method.

2. The method according to claim 1, wherein the release member, which is provided with an ink streak portion for forming the source and drain electrodes and has mold releasability, is obtained through a process of applying conductive ink onto an entire surface of the release member and a process of pressing the relief printing plate against a surface of the conductive ink applied onto the release member, with using a relief printing plate provided with a convex portion which is a reverse pattern of the streak portion and the release member having mold releasability, and wherein the release member is a release member in which the streak portion corresponding to the source electrode and the drain electrode is formed by removing a non-streak portion pressed by the relief printing plate.

3. The method according to claim 1, wherein a standard deviation of a channel length L is equal to or less than 0.5 µm.

4. The method according to claim 1, wherein the semiconductor layer is constituted by an organic semiconductor.

5. A thin film transistor having a top gate bottom contact structure obtained by the method of manufacturing a thin film transistor having a top gate bottom contact structure according to claim 1.

6. A transistor array obtained by integrating a plurality of the thin film transistors having a top gate bottom contact structure obtained by the method of manufacturing a thin film transistor having a top gate bottom contact structure according to claim 1.

* * * * *